US011859285B2

(12) United States Patent
Iriuda et al.

(10) Patent No.: US 11,859,285 B2
(45) Date of Patent: Jan. 2, 2024

(54) PROCESSING APPARATUS AND PROCESSING METHOD

(71) Applicant: Tokyo Electron Limited, Tokyo (JP)

(72) Inventors: Hiroki Iriuda, Yamanashi (JP); Kuniyasu Sakashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/472,920

(22) Filed: Sep. 13, 2021

(65) Prior Publication Data

US 2022/0081773 A1  Mar. 17, 2022

(30) Foreign Application Priority Data

Sep. 17, 2020 (JP) ................. 2020-156408

(51) Int. Cl.
| | |
|---|---|
| *C23C 16/455* | (2006.01) |
| *H01L 21/02* | (2006.01) |
| *C23C 16/52* | (2006.01) |

(52) U.S. Cl.
CPC .. *C23C 16/45578* (2013.01); *C23C 16/45546* (2013.01); *C23C 16/52* (2013.01); *H01L 21/0228* (2013.01)

(58) Field of Classification Search
CPC ................ C23C 16/45578; C23C 16/45546
See application file for complete search history.

(56) References Cited

U.S. PATENT DOCUMENTS

| | | | |
|---|---|---|---|
| 2010/0035437 A1* | 2/2010 | Yamazaki | ............... F16L 25/00 |
| | | | 118/724 |
| 2017/0022610 A1* | 1/2017 | Seo | ...................... C23C 16/4584 |
| 2019/0106787 A1* | 4/2019 | Ohno | ................ C23C 16/45563 |
| 2019/0345605 A1* | 11/2019 | Mimura | ............ C23C 16/45523 |

FOREIGN PATENT DOCUMENTS

| | | |
|---|---|---|
| JP | 2011-135044 A | 7/2011 |
| JP | 2018-195727 A | 12/2018 |
| WO | WO2017212546 | * 12/2017 |
| WO | WO2018154823 | * 8/2018 |

* cited by examiner

*Primary Examiner* — Joseph A Miller, Jr.
(74) *Attorney, Agent, or Firm* — Venjuris, P.C.

(57) ABSTRACT

A processing apparatus includes: a processing container having a substantially cylindrical shape; a gas nozzle extending in a longitudinal direction of the processing container along an inside of a side wall of the processing container; an exhaust body formed on the side wall on an opposite side of the processing container to face the processing gas nozzle; and an adjustment gas nozzle configured to eject a concentration adjustment gas toward a center of the processing container. The adjustment gas nozzle is provided within an angle range in which the exhaust body is formed at a central angle with reference to the center of the processing container in a plan view from the longitudinal direction.

19 Claims, 8 Drawing Sheets

PROCESSING APPARATUS AND PROCESSING METHOD

CROSS-REFERENCE TO RELATED APPLICATIONS

This application is based on and claims priority from Japanese Patent Application No. 2020-156408 filed on Sep. 17, 2020 with the Japan Patent Office, the disclosure of which is incorporated herein in its entirety by reference.

TECHNICAL FIELD

The present disclosure relates to a processing apparatus and a processing method.

BACKGROUND

There is known a film forming apparatus including a gas dispersion nozzle extending in the vertical direction along an inside of a side wall of a cylindrical shape processing container and having a plurality of gas ejection holes formed over a length in the vertical direction corresponding to a wafer support range of a wafer boat (see, e.g., Japanese Patent Laid-Open Publication No. 2011-135044). Further, there is known a film forming apparatus including a concentration adjustment gas dispersion nozzle at a position different from the position where the gas dispersion nozzle configured to eject a raw material gas (see, e.g., Japanese Patent Laid-Open Publication No. 2018-195727).

SUMMARY

A processing apparatus according to an aspect of the present disclosure includes: a processing container having substantially cylindrical shape; a processing gas nozzle extending in a longitudinal direction of the processing container along an inside of a side wall of the processing container; an exhaust structure formed on the side wall on an opposite side of the processing container to face the processing gas nozzle; and a concentration adjustment gas nozzle configured to eject a concentration adjustment gas toward a center of the processing container. The concentration adjustment gas nozzle is provided within an angle range in which the exhaust structure is formed at a central angle with reference to the center of the processing container in a plan view from the longitudinal direction.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
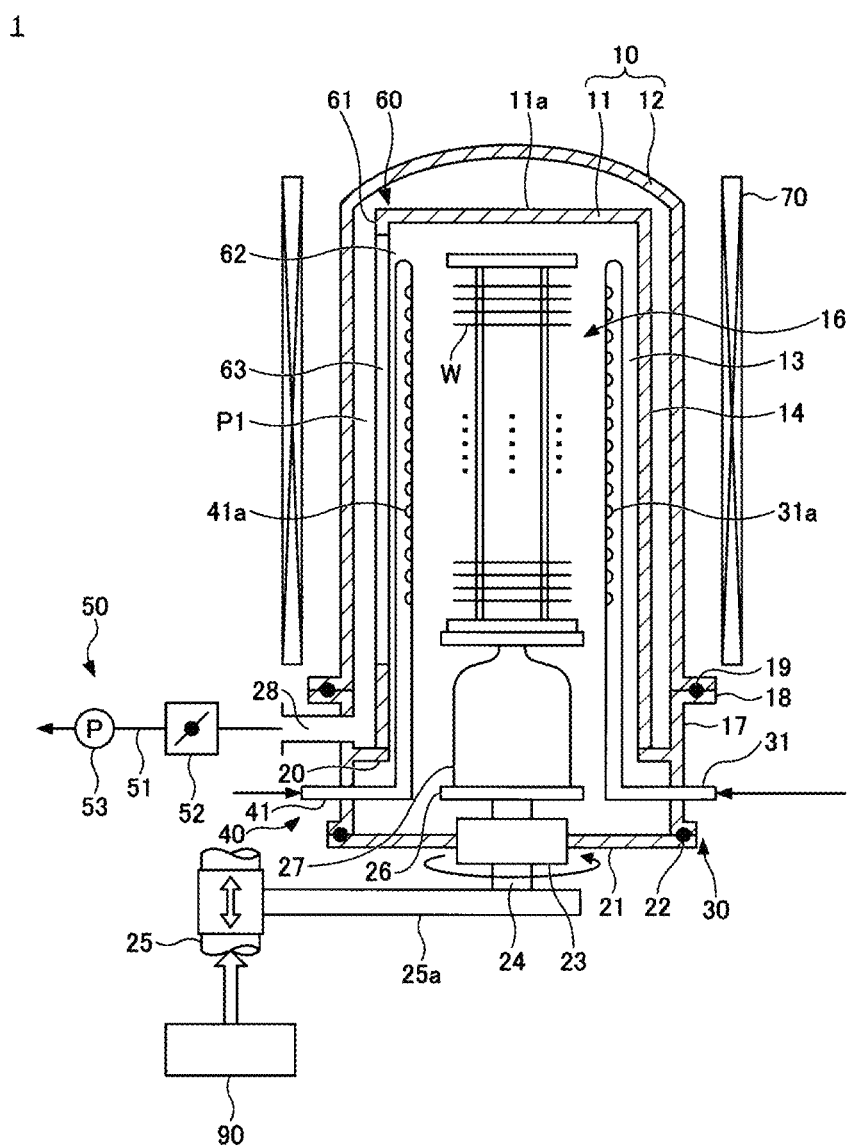
FIG. 1 is a schematic view illustrating an example of a processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[In-Plane Distribution of Film Thickness]

As a device design becomes finer and more complicated, it is required to form a film with good in-plane uniformity for a pattern having a large surface area formed on a wafer in a film forming processing using a batch type vertical heat treatment apparatus. In the vertical heat treatment apparatus, a gas is supplied from the periphery of the wafer toward the center of the wafer. Therefore, a large amount of gas is consumed at the end portion of the wafer, so that it is difficult for the gas to evenly spread to the center of the wafer as compared with the end portion of the wafer. As a result, the film thickness at the center of the wafer tends to be thinner than the film thickness at the end portion of the wafer.

In the following embodiment, descriptions will be made on a processing apparatus and a processing method capable of locally reducing the film thickness at the end portion of the wafer while suppressing a decrease in the raw material gas concentration at the center of the wafer.

[Processing Apparatus]

Figure 2:
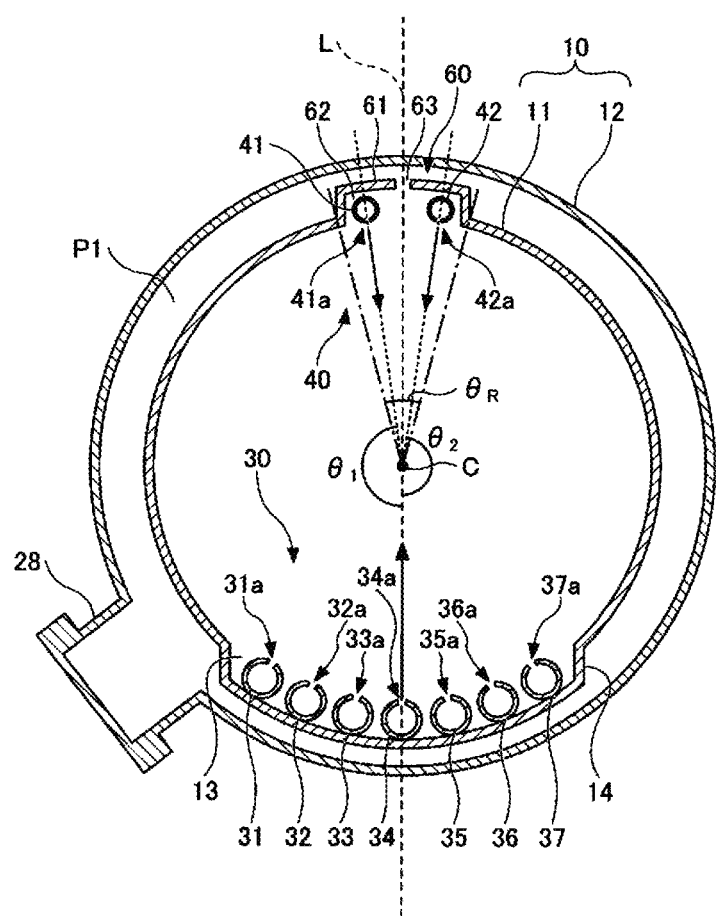
FIG. 2 is a schematic view illustrating an example of arrangement of gas nozzles.

An example of a processing apparatus according to an embodiment will be described with reference to FIGS. 1 and 2. FIG. 1 is a schematic view illustrating an example of the processing apparatus according to the embodiment. FIG. 2 is a schematic view illustrating an example of arrangement of gas nozzles.

The processing apparatus 1 includes a processing container 10, a processing gas supply 30, an inert gas supply 40, an exhauster 50, an exhaust structure 60, a heater 70, and a controller 90.

The processing container 10 includes an inner tube 11 and an outer tube 12. The inner tube 11 is formed in a substantially cylindrical shape with a ceiling having an opened lower end. The inner tube 11 has a ceiling 11a formed in, for example, a flat shape. The outer tube 12 is formed in a substantially cylindrical shape with a ceiling having an opened lower end and covering the outside of the inner tube 11. The inner tube 11 and the outer tube 12 are coaxially arranged to be a double tube structure. The inner tube 11 and the outer tube 12 are made of a heat-resistant material such as, for example, quartz.

At one side of the inner tube 11, an accommodation portion 13 that accommodates a gas nozzle along the longitudinal direction (vertical direction) thereof is formed. In the accommodation portion 13, a convex portion 14 is formed by protruding a portion of a side wall of the inner tube 11 toward the outside, and the inside of the convex portion 14 is formed as the accommodation portion 13.

The exhaust structure 60 is formed on a side wall on an opposite side of the inner tube 11 facing the accommodation portion 13. The exhaust structure 60 accommodates the gas nozzle along the longitudinal direction (vertical direction) of the inner tube 11. In the exhaust structure 60, a protruding portion 61 is formed by protruding a portion of the side wall of the inner tube 11 toward the outside, and the inside of the protruding portion 61 is formed as an accommodation portion 62. An exhaust slit 63 is formed in a portion of the tip end of the protruding portion 61. The exhaust slit 63 exhausts a gas in the inner tube 11. The exhaust slit 63 has a rectangular shape having a long side in the longitudinal direction (vertical direction) of the inner tube 11. The exhaust slit 63 has the same length as a length of a boat 16 (to be described later), or extends in each of the upper and lower directions to be longer than the length of the boat 16.

The processing container 10 accommodates the boat 16. The boat 16 holds a plurality of substrates substantially horizontally at intervals in the vertical direction. The substrate may be, for example, a semiconductor wafer (hereinafter, also referred to as a "wafer W").

A lower end of the processing container 10 is supported by a substantially cylindrical manifold 17 made of, for example, stainless steel. A flange 18 is formed on an upper end of the manifold 17, and a lower end of the outer tube 12 is installed to be supported on the flange 18. A seal member 19 such as an O-ring is interposed between the flange 18 and the lower end of the outer tube 12 so that the inside of the outer tube 12 is in an air-tight state.

An annular support 20 is provided on an inner wall of an upper portion of the manifold 17. The support 20 supports the lower end of the inner tube 11. A cover body 21 is air-tightly attached to an opening at the lower end of the manifold 17 through a seal member 22 (e.g., an O-ring). The cover body 21 air-tightly closes the opening at the lower end of the processing container 10, that is, the opening of the manifold 17. The cover body 21 is made of, for example, stainless steel.

A rotation shaft 24 penetrates the center of the cover body 21 and rotatably supports the boat 16 through a magnetic fluid sealing 23. A lower portion of the rotation shaft 24 is rotatably supported by an arm 25a of an elevating mechanism 25 including a boat elevator.

A rotation plate 26 is provided on the upper end of the rotation shaft 24. The boat 16 is placed on the rotation plate 26 to hold the wafer W through a heat preservation stage 27 made of quartz. Therefore, the cover body 21 and the boat 16 are integrally moved up or down by moving the elevating mechanism 25 up or down, so that the boat 16 is able to be inserted into or removed from the processing container 10.

The processing gas supply 30 supplies the processing gas into the inner tube 11. The processing gas supply 30 includes a plurality (e.g., seven) of gas nozzles 31 to 37.

The plurality of gas nozzles 31 to 37 are disposed to be aligned in a line along the circumferential direction in the accommodation portion 13 of the inner tube 11. Each of the gas nozzles 31 to 37 is provided in the inner tube 11 along the longitudinal direction thereof, and its base end is bent in an L shape and supported so as to penetrate the manifold 17. Each of the gas nozzles 31 to 37 has a plurality of gas holes 31a to 37a at predetermined intervals along the longitudinal direction. The plurality of gas holes 31a to 37a are oriented toward, for example, a center C of the inner tube 11 (the wafer W side).

The gas nozzles 31 to 37 eject various processing gases, for example, a raw material gas, a reaction gas, an etching gas, or a purge gas substantially horizontally from the plurality of gas holes 31a to 37a toward the wafer W. The raw material gas may be, for example, a gas containing silicon (Si) or metal. The reaction gas is a gas that reacts with the raw material gas to produce a reaction product, and may be, for example, a gas containing oxygen or nitrogen. The etching gas is a gas that etches various films, and may be, for example, a gas containing halogen such as fluorine, chlorine, or bromine. The purge gas is a gas that purges the raw material gas or the reaction gas remaining in the processing container 10, and may be, for example, an inert gas.

The inert gas supply 40 supplies the inert gas into the inner tube 11. The inert gas supply 40 includes two gas nozzles 41 and 42.

The gas nozzles 41 and 42 are disposed in the accommodation portion 62 of the exhaust structure 60 symmetrically with respect to a straight line L that connects the center C of the inner tube 11 and the center of the exhaust structure 60 (exhaust slit 63). Each of the gas nozzles 41 and 42 is provided in the inner tube 11 along the longitudinal direction thereof, and its base end is bent in an L shape and supported so as to penetrate the manifold 17. Each of the gas nozzles 41 and 42 has a plurality of gas holes 41a and 42a at predetermined intervals along the longitudinal direction. The plurality of gas holes 41a and 42a are provided in the same number as, for example, the plurality of gas holes 34a, and are provided at the same height positions as those of the plurality of gas holes 34a. The plurality of gas holes 41a and 42a are oriented toward, for example, the center C of the inner tube 11 (the wafer W side).

Each of the gas nozzles 41 and 41 ejects the inert gas substantially horizontally from the plurality of gas holes 41a and 42a toward the wafer W. The inert gas may be, for example, a nitrogen ($N_2$) gas or an argon (Ar) gas.

The gas nozzles 41 and 42 are provided within an angle range OR in which the exhaust structure 60 is formed at a central angle with reference to the center C of the inner tube 11 in a plan view from the longitudinal direction of the inner tube 11. For example, when a position of the gas nozzle 34 is set as a starting point of a central angle of 0° with reference to the center of the inner tube 11 in a plan view in the longitudinal direction of the inner tube 11, the gas nozzles 41 and 42 are provided within a range of the central angle from 150° or more to 180° or less. That is, the gas nozzle 41 is provided at a position where a line segment that connects the center C of the inner tube 11 and the center of the gas nozzle 34 and a line segment that connects the center C of the inner tube 11 and the center of the gas nozzle 41 form an angle $\theta_1$ of 150° or more and 180° or less. The gas nozzle 42 is provided at a position where a line segment that connects the center C of the inner tube 11 and the center of the gas nozzle 34 and a line segment that connects the center C of the inner tube 11 and the center of the gas nozzle 42 form an angle $\theta_2$ of 150° or more and 180° or less. Therefore, it is possible to decrease the processing gas concentration at the end portion of the wafer while suppressing the decrease in the processing gas concentration at the center of the wafer due to the inert gas supplied from the gas nozzles 41 and 42. Further, from the viewpoint that the decrease in the processing gas concentration at the center of the wafer due to the inert gas supplied from the gas nozzles 41 and 42 may be particularly suppressed, the angle $\theta_1$ and the angle $\theta_2$ may further be 170° or more, and 180° or less.

The exhauster 50 exhausts the gas discharged from inside the inner tube 11 through the exhaust slit 63, and discharged from a gas outlet 28 through a space P1 between the inner tube 11 and the outer tube 12. The gas outlet 28 is formed above the support 20 as the side wall of the upper portion of the manifold 17. An exhaust passage 51 is connected to the gas outlet 28. A pressure adjusting valve 52 and a vacuum pump 53 are interposed in order in the exhaust passage 51, so that the inside of the processing container 10 may be exhausted.

The heater 70 is provided around the outer tube 12. The heater 70 is provided to, for example, a base plate (not illustrated). The heater 70 has a substantially cylindrical shape so as to cover the outer tube 12. The heater 70 includes, for example, a heating element to heat the wafer W in the processing container 10.

The controller 90 controls an operation of each component of the processing apparatus 1. The controller 90 may be, for example, a computer. A computer program that performs an operation of each component of the processing apparatus 1 is stored in a storage medium. The storage medium may be, for example, a flexible disk, a compact disk, a hard disk, a flash memory, and a DVD.

[Processing Method]

Description will be made on a method for forming a silicon oxide film on the wafer W according to an atomic layer deposition (ALD) method using the processing apparatus 1 illustrated in FIGS. 1 and 2, as an example of a processing method of an embodiment.

First, the controller 90 controls the elevating mechanism 25 such that the boat 16 holding a plurality of wafers W is carried into the processing container 10, and the opening at the lower end of the processing container 10 is air-tightly closed and sealed by the cover body 21.

Subsequently, the controller 90 repeats a cycle including a step of supplying the raw material gas S1, a step of purging S2, a step of supplying the reaction gas S3, and a step of purging S4 a predetermined number of times, thereby forming a silicon oxide film having a desired thickness on a plurality of wafers W.

In step S1, a silicon-containing gas, which is a raw material gas, is ejected from the gas nozzle 34 into the processing container 10, thereby adsorbing the silicon-containing gas on the plurality of wafers W. At this time, an $N_2$ gas, which is an inert gas, is ejected from the gas nozzles 41 and 42 into the processing container 10.

In step S2, for example, the silicon-containing gas remaining in the processing container 10 is discharged by a cycle purge in which a gas replacement and a vacuum processing are repeated. The gas replacement is an operation that supplies a purge gas from at least one of the seven gas nozzles 31 to 37 into the processing container 10. The vacuum processing is an operation that exhausts the inside of the processing container 10 by the vacuum pump 53.

In step S3, an oxidizing gas, which is the reaction gas, is ejected from at least one of the gas nozzles 31 to 37 into the processing container 10, thereby oxidizing the silicon raw material gas adsorbed on the plurality of wafers W by the oxidizing gas. At this time, an inert gas may or may not be ejected from the gas nozzles 41 and 42 into the processing container 10.

In step S4, for example, the oxidizing gas remaining in the processing container 10 is discharged by a cycle purge in which a gas replacement and a vacuum processing are repeated. Step S4 may be to the same as step S2.

After repeating the ALD cycle including steps S1 to S4 a predetermined number of times, the controller 90 controls the elevating mechanism 25 to carry the boat 16 out from the processing container 10.

Description will be made on a method for forming a silicon film on the wafer W according to a chemical vapor deposition (CVD) method using the processing apparatus 1 illustrated in FIGS. 1 and 2, as another example of the processing method of the embodiment.

First, the controller 90 controls the elevating mechanism 25 such that the boat 16 holding a plurality of wafers W is carried into the processing container 10, and the opening at the lower end of the processing container 10 is air-tightly closed and sealed by the cover body 21.

Subsequently, the controller 90 ejects the silicon-containing gas, which is the raw material gas from the gas nozzle 34 into the processing container 10, thereby forming a silicon film having a desired film thickness on the wafer W. At this time, an $N_2$ gas is ejected from the gas nozzles 41 and 42 into the processing container 10.

Subsequently, the controller 90 controls the elevating mechanism 25 such that the boat 16 is carried out from inside the processing container 10.

According to the embodiment described above, the gas nozzles 41 and 42 are provided within the angle range $\theta_R$ in which the exhaust structure 60 is formed at the central angle with reference to the center C of the inner tube 11 in a plan view from the longitudinal direction of the inner tube 11. Therefore, when ejecting the raw material gas from the gas nozzle 34 into the processing container 10, an inert gas may be supplied from the gas nozzles 41 and 42 provided within the angle range $\theta_R$ in which the exhaust structure 60 is formed. As a result, it is possible to decrease the raw material gas concentration at the end portion of the wafer while suppressing the decrease in the raw material gas concentration at the center of the wafer due to the inert gas supplied from the gas nozzles 41 and 42.

Further, since the raw material gas concentration at the end portion of the wafer may be adjusted by changing the flow rate of the inert gas ejected from the gas nozzles 41 and 42, it is possible to easily form a film having a desired film thickness distribution.

[Simulation Result]

First, in the batch type vertical heat treatment apparatus as illustrated in FIGS. 1 and 2, a simulation by thermofluid analysis is implemented with respect to the raw material gas concentration distribution in the processing container when the position of the $N_2$ gas nozzle and the flow rate of $N_2$ gas (hereinafter, referred to as "$N_2$ flow rate") are changed. The conditions of the simulation are as follows.

[Simulation Conditions]

Position of $N_2$ gas nozzle: 30°, 60°, 120°, and 175°

$N_2$ flow rate for each nozzle: 1,000 sccm, 2,000 sccm, and 3,000 sccm

The position of the $N_2$ gas nozzle is indicated by an angle when the position of the raw material gas nozzle is set as the starting point of the central angle of 0° with reference to the center of the processing container in a plan view from the longitudinal direction of the processing container.

Figure 3:
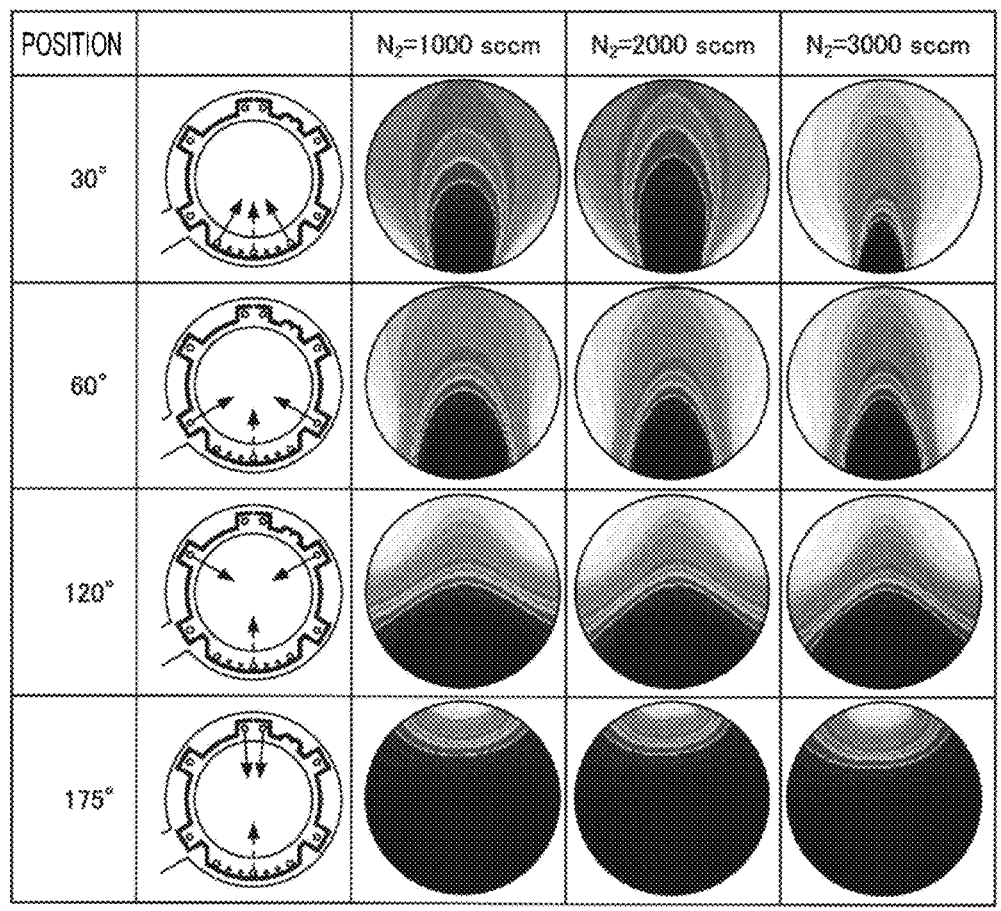
FIG. 3 is a view illustrating an analysis result of a raw material gas concentration distribution when a position of an $N_2$ gas nozzle is changed.

FIG. 3 is a view illustrating an analysis result of the raw material gas concentration distribution when a position of the $N_2$ gas nozzle is changed. FIG. 3 illustrates an analysis result of the raw material gas concentration distribution on the wafer when the position of the $N_2$ gas nozzle and the $N_2$ flow rate are changed. FIG. 3 illustrates analysis results when the positions of the $N_2$ gas nozzles are 30°, 60°, 120°, and 175° in order from the upper tier. Further, FIG. 3 illustrates the positions of the $N_2$ gas nozzles, diagrams explaining the positions of the $N_2$ gas nozzles, and analysis results of the raw material gas concentration distribution when the $N_2$ flow rate is 1,000 sccm, 2,000 sccm, and 3,000 sccm. In the diagrams explaining the positions of the $N_2$ gas nozzles, the ejection direction of the raw material gas ejected by the raw material gas nozzle is indicated by a broken line arrow, and the ejection direction of the $N_2$ gas ejected by the $N_2$ gas nozzle is indicated by a solid line arrow. In the analysis result of the raw material gas concentration distribution, the range from the minimum concentration to the maximum concentration of the raw material gas for each condition is divided into multiple levels and illustrated in gray scale. As the color is darker (closer to black), the concentration increases.

As illustrated in FIG. 3, a change in the raw material gas concentration distribution on the wafer is observed by changing the position of the $N_2$ gas nozzle and the $N_2$ flow rate. Specifically, when the position of the $N_2$ gas nozzle is 30°, the raw material gas concentration decreases from the position of 30°. When the position of the $N_2$ gas nozzle is 60°, the raw material gas concentration decreases from the position of 60°. When the position of the $N_2$ gas nozzle is 120°, the raw material gas concentration decreases from the position of 120°. When the position of the $N_2$ gas nozzle is 175°, the raw material gas concentration decreases from the position of 175°. As described above, from the analysis result illustrated in FIG. 3, it is seen that the raw material gas concentration decreases from the position of the $N_2$ gas nozzle by ejecting the $N_2$ gas. Further, as illustrated in FIG. 3, the raw material gas concentration decreases as the $N_2$ flow rate increases. As described above, from the analysis result illustrated in FIG. 3, it is seen that the raw material gas concentration at the end portion of the wafer may be decreased by increasing the $N_2$ flow rate.

Figure 4:
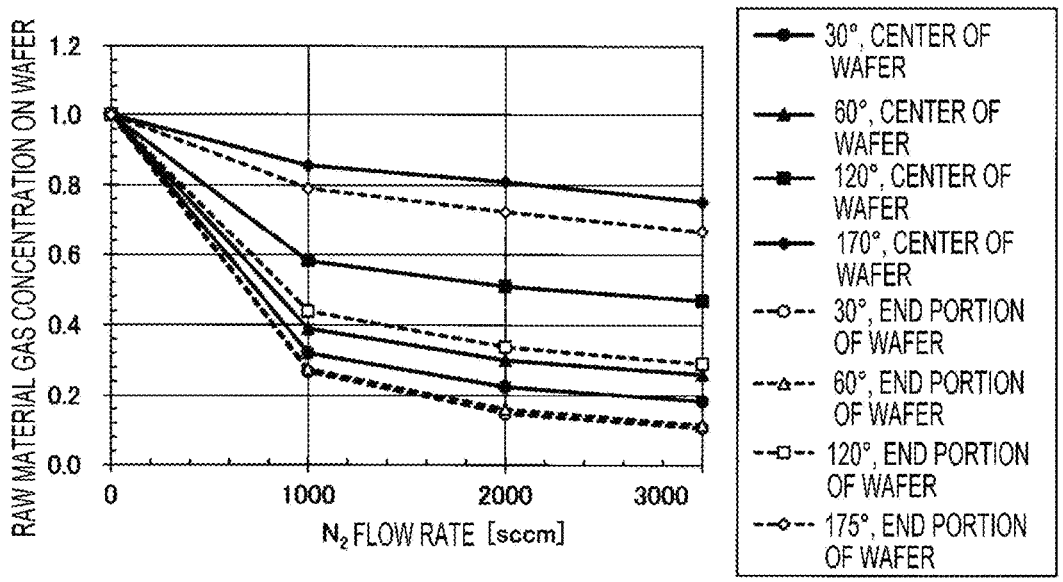
FIG. 4 is a view illustrating an analysis result of a raw material gas concentration when the position of the $N_2$ gas nozzle is changed.

FIG. 4 is a view illustrating the analysis result of the raw material gas concentration when the position of the $N_2$ gas nozzle is changed. In FIG. 4, the horizontal axis indicates the $N_2$ flow rate (sccm) for each nozzle, and the vertical axis indicates the raw material gas concentration on the wafer. The raw material gas concentration on the wafer is a value standardized by the raw material gas concentration when the $N_2$ gas is not ejected.

As illustrated in FIG. 4, the raw material gas concentration at the center of the wafer when the position of the $N_2$ gas nozzle is 30°, 60°, and 120° largely decreases as compared with the raw material gas concentration at the center of the wafer when the $N_2$ gas is not ejected. It is considered that this is because the raw material gas is diluted by mixing the raw material gas and the $N_2$ gas on the wafer, thereby decreasing the raw material gas concentration. Meanwhile, the raw material gas concentration at the center of the wafer when the position of the $N_2$ gas nozzle is 175° decreases as compared with the raw material gas concentration at the center of the wafer when the $N_2$ gas is not ejected, but the amount of decrease is small. As described above, from the analysis result illustrated in FIG. 4, it is seen that, by setting the position of the $N_2$ gas nozzle to 175°, the raw material gas concentration at the end portion of the wafer may be decreased while suppressing the decrease in the raw material gas concentration at the center of the wafer due to the $N_2$ gas.

As described above, since the raw material gas concentration at the end portion of the wafer may be adjusted to be low by setting the position of the $N_2$ gas nozzle to 175° while keeping the raw material gas concentration at the center of the wafer high, it is considered that a film may be formed with good in-plane uniformity for a pattern having a large surface area.

Next, in the batch type vertical heat treatment apparatus as illustrated in FIGS. 1 and 2, a simulation by thermofluid analysis is implemented with respect to the raw material gas concentration distribution in the processing container when the shape of the exhaust structure is changed.

In the simulation, the raw material gas concentration distribution is analyzed when the position of the $N_2$ gas nozzle is set to 175°, and the $N_2$ flow rate for each nozzle is changed to 1,000 sccm, 2,000 sccm, and 3,000 sccm for the following three levels X1, X2, and X3. The position of the $N_2$ gas nozzle is indicated by the angle when the position of the raw material gas nozzle is set as the starting point of the central angle of 0° with reference to the center of the processing container in a plan view from the longitudinal direction of the processing container.

In the level X1, the exhaust structure has a protruding portion formed by protruding a portion of the side wall of the processing container toward the outside, the exhaust slit is formed in a portion of the tip end of the protruding portion, and the $N_2$ gas nozzle is disposed inside the protruding portion (position closer to the center of the processing container than the exhaust slit).

In the level X2, the exhaust structure has a protruding portion formed by protruding a portion of the side wall of the processing container toward the outside, the exhaust slit is formed at the entire tip end of the protruding portion, and the $N_2$ gas nozzle is disposed inside the protruding portion (position closer to the center of the processing container than the exhaust slit).

In the level X3, the exhaust structure is formed by the exhaust slit that opens a portion of the side wall of the processing container, and the $N_2$ gas nozzle is disposed at a position away from the center of the processing container from the exhaust slit.

In all the levels X1 to X3, the $N_2$ gas nozzle is provided in an angle range in which the exhaust structure is formed at a central angle with reference to the center of the processing container.

Figure 5:
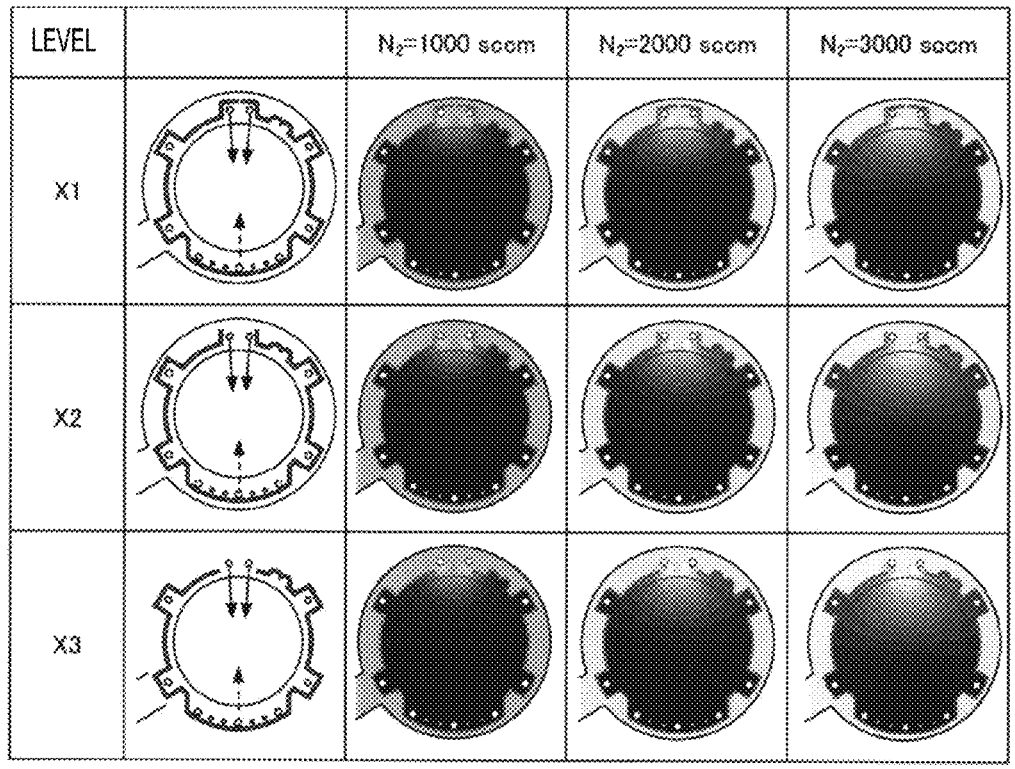
FIG. 5 is a view illustrating an analysis result of a raw material gas concentration distribution when a shape of an exhaust structure is changed.

FIG. 5 is a view illustrating an analysis result of the raw material gas concentration distribution when the shape of the exhaust structure is changed. FIG. 5 illustrates the analysis result of the raw material gas concentration distribution on the wafer when the $N_2$ flow rate is changed for each of the levels X1 to X3. FIG. 5 illustrates the analysis results for the levels X1, X2, and X3 in order from the upper tier. FIG. 5 illustrates the levels, diagrams explaining the positions of the $N_2$ gas nozzles, and analysis results of the raw material gas concentration distribution when the $N_2$ flow rate is 1,000 sccm, 2,000 sccm, and 3,000 sccm in order from the left column. In the diagrams explaining the positions of the $N_2$ gas nozzles, the ejection direction of the raw material gas ejected by the raw material gas nozzle is indicated by a broken line arrow, and the ejection direction of the $N_2$ gas ejected by the $N_2$ gas nozzle is indicated by a solid line arrow. In the analysis results of the raw material gas concentration distribution, the raw material gas concentration is illustrated in gray scale in the same range for all conditions. As the color is darker (closer to black), the concentration increases.

Figure 6:
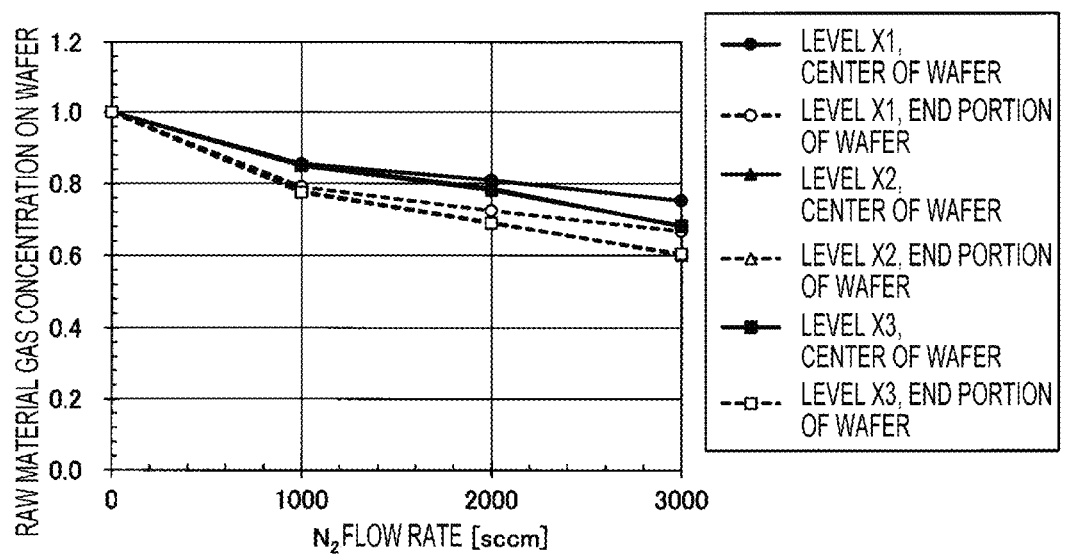
FIG. 6 is a view illustrating an analysis result of a raw material gas concentration when the shape of the exhaust structure is changed.

FIG. 6 is a view illustrating an analysis result of the raw material gas concentration when the shape of the exhaust structure is changed. In FIG. 6, the horizontal axis indicates the $N_2$ flow rate (sccm) for each nozzle, and the vertical axis indicates the raw material gas concentration on the wafer. The raw material gas concentration on the wafer is a value standardized by the raw material gas concentration when the $N_2$ gas is not ejected.

As illustrated in FIGS. 5 and 6, in all the levels X1 to X3, the change in the raw material gas concentration distribution when the $N_2$ flow rate is changed to 1,000 sccm, 2,000 sccm, and 3,000 sccm illustrates substantially the same tendency. As described above, from the analysis result illustrated in FIG. 5, it is seen that it is important that the position of the $N_2$ gas nozzle is in the vicinity of the exhaust structure. More specifically, it is seen that, when there is no shield between the $N_2$ gas nozzle and the wafer, the $N_2$ gas nozzle may obtain substantially the same effect at a position closer to or farther from the center of the processing container than the exhaust slit.

Next, in the batch type vertical heat treatment apparatus as illustrated in FIGS. 1 and 2, a simulation by thermofluid analysis is implemented with respect to the raw material gas concentration distribution in the processing container when the position of the $N_2$ gas nozzle and the $N_2$ flow rate are changed. The conditions of the simulation are as follows.

[Simulation Conditions]

Position of $N_2$ gas nozzle: 60°, 90°, 120°, 130°, 140°, 150°, 160°, 170°, 175°, and 180°

$N_2$ flow rate for each nozzle: 1,000 sccm, 2,000 sccm, and 3,000 sccm

Figure 7:
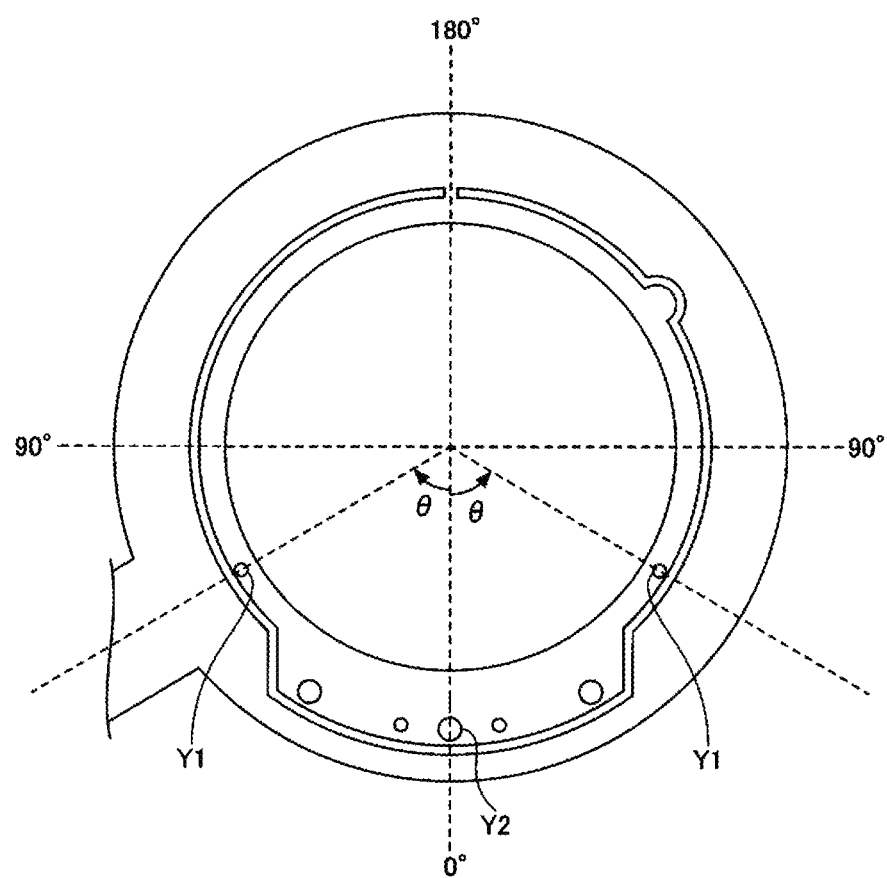
FIG. 7 is a view explaining a position of the $N_2$ gas nozzle.

FIG. 7 is a view explaining the position of the $N_2$ gas nozzle. As illustrated in FIG. 7, a position Y1 of the $N_2$ gas nozzle is indicated by an angle θ when a position Y2 of the raw material gas nozzle is set as the starting point of the central angle of 0° with reference to the center of the processing container in a plan view from the longitudinal direction of the processing container.

Figure 8:
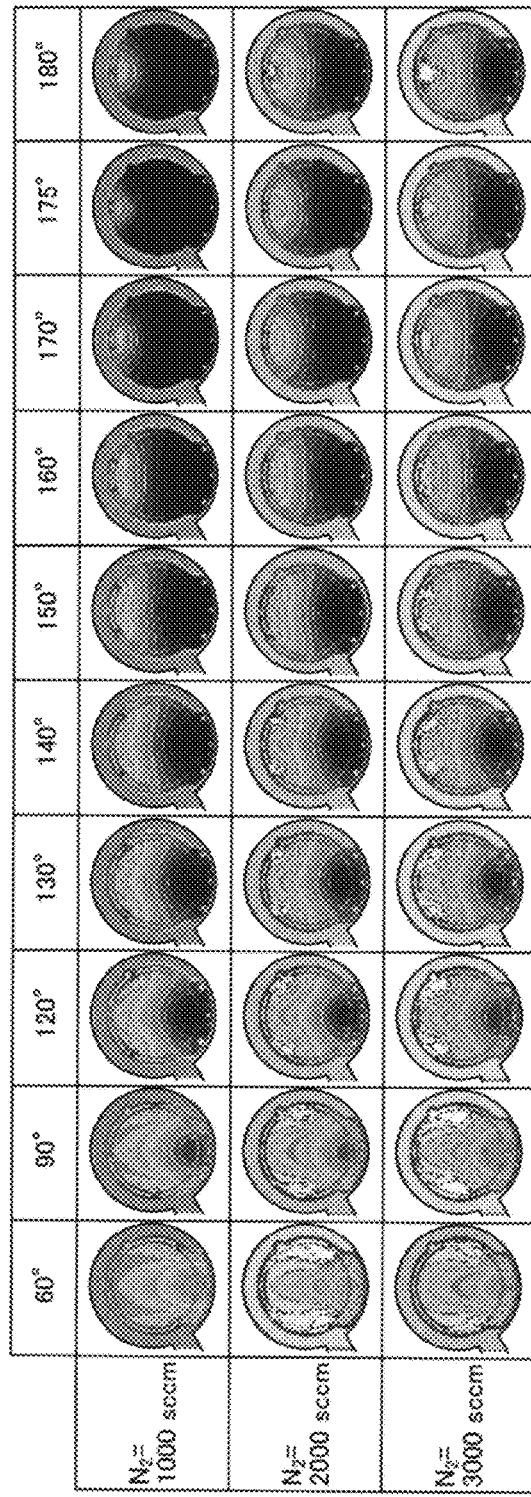
FIG. 8 is a view illustrating an analysis result of a raw material gas concentration distribution when a position of an $N_2$ gas nozzle is changed.

FIG. 8 is a view illustrating an analysis result of the raw material gas concentration distribution when the position of the $N_2$ gas nozzle is changed. FIG. 8 illustrates an analysis result of the raw material gas concentration distribution on the wafer when the position of the $N_2$ gas nozzle and the $N_2$ flow rate are changed. FIG. 8 illustrates analysis results when the positions of the $N_2$ gas nozzles are 60°, 90°, 120°, 130°, 140°, 150°, 160°, 170°, 175°, and 180° in order from the left column. Further, FIG. 8 illustrates analysis results when the $N_2$ flow rate is 1,000 sccm, 2,000 sccm, and 3,000 sccm in order from the upper tier. In the analysis results of the raw material gas concentration distribution, the raw material gas concentration is illustrated in gray scale in the same range for all conditions. As the color is darker (closer to black), the concentration increases.

As illustrated in FIG. 8, when the position of the raw material gas nozzle is 0°, and the position of the exhaust slit is 180°, it is found that, by disposing $N_2$ gas nozzle at a position close to 180°, the raw material gas concentration at the end portion of the wafer may be adjusted while suppressing the decrease in the raw material gas concentration at the center of the wafer.

Figure 9:
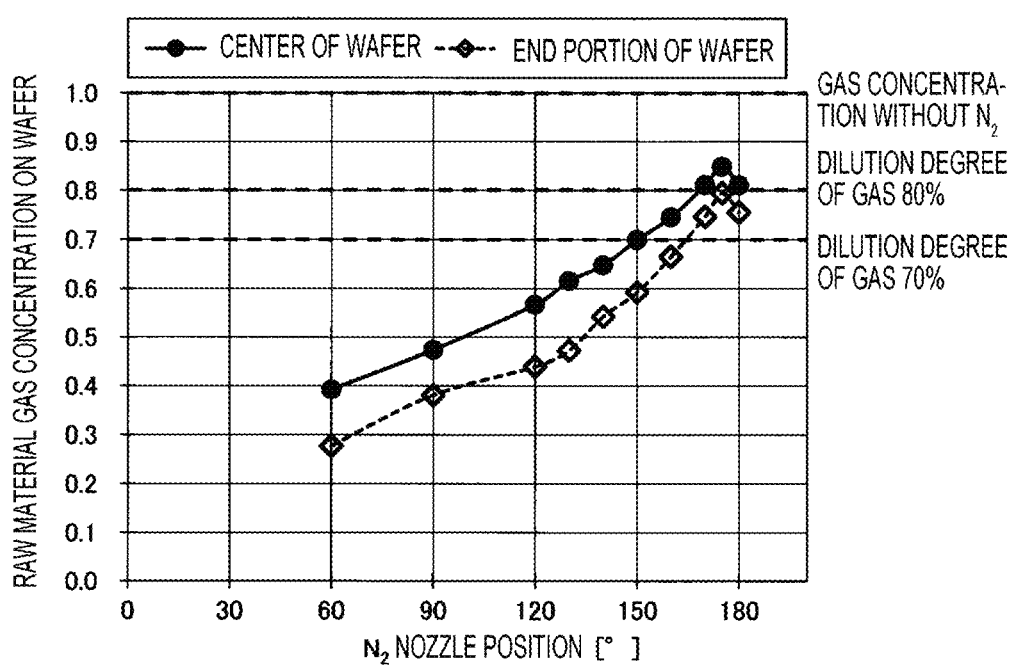
FIG. 9 is a view illustrating an analysis result of a raw material gas concentration when the position of the $N_2$ gas nozzle is changed.

FIG. 9 is a view illustrating an analysis result of the raw material gas concentration when the position of the $N_2$ gas nozzle is changed. FIG. 9 illustrates an analysis result when the $N_2$ flow rate for each nozzle is set to 1,000 sccm. In FIG. 9, the horizontal axis indicates the position "deg." of the $N_2$ gas nozzle, and the vertical axis indicates the raw material gas concentration on the wafer. The raw material gas concentration on the wafer is a value standardized by the raw material gas concentration when the $N_2$ gas is not ejected.

As illustrated in FIG. 9, when the position of the $N_2$ gas nozzle is in a range of 150° to 180°, the gas concentration at the center of the wafer is 0.7 or more. From this result, it may be said that the dilution degree of the raw material gas at the center of the wafer is suppressed to 70% by setting the position of the $N_2$ gas nozzle to be in a range of 150° to 180°, and thus, the film thickness distribution in the wafer plane may be adjusted.

Further, as illustrated in FIG. 9, when the position of the $N_2$ gas nozzle is in a range of 170° to 180°, the gas concentration at the center of the wafer is 0.8 or more. From this result, it may be said that the dilution degree of the raw material gas at the center of the wafer is suppressed to 80% by setting the position of the $N_2$ gas nozzle to be in a range of 170° to 180°, and thus, the film thickness distribution in the wafer plane may be adjusted.

As described above, from the result illustrated in FIG. 9, from the viewpoint that the film thickness distribution in the wafer plane while suppressing the decrease in the raw material gas concentration at the center of the wafer, it may be said that the position of the $N_2$ gas nozzle may be 150° or more and 180° or less. Among this, it may be said that the position of the $N_2$ gas nozzle may further be 170° or more and 180° or less.

In the above-described embodiment, the raw material gas is an example of a processing gas, and the inert gas is an example of a concentration adjustment gas. Further, in the above-described embodiment, the gas nozzles 31 to 37 are examples of processing gas nozzles, and the gas nozzles 41 and 42 are examples of concentration adjustment gas nozzles.

In the above-described embodiment, descriptions have been made on the case where the processing gas is the raw material gas, but the present disclosure is not limited thereto. For example, the processing gas may be a reaction gas.

In the above-described embodiment, descriptions have been made on the case where the gas nozzle is an L-shaped pipe, but the present disclosure is not limited thereto. For example, the gas nozzle may be a straight pipe that extends inside the side wall of the inner tube along the longitudinal direction of the inner tube, and is supported by inserting the lower end thereof into a nozzle support (not illustrated).

In the above-described embodiment, descriptions have been made on the case where the processing apparatus is a non-plasma apparatus, but the present disclosure is not limited thereto. For example, the processing apparatus may be a plasma apparatus such as a capacitively coupled plasma apparatus or an inductively coupled plasma apparatus.

According to the present disclosure, it is possible to control the concentration distribution of the reactive species on the substrate.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
    a processing container having a substantially cylindrical shape including an inner tube and an outer tube that are coaxially arranged with a space therebetween;

a processing gas nozzle extending in a longitudinal direction of the processing container along an inside of a side wall of the inner tube of the processing container;
an exhaust body formed on the side wall of the inner tube on an opposite side of the inner tube of the processing container to face the processing gas nozzle; and
an adjustment gas nozzle provided within the exhaust body and configured to eject a concentration adjustment gas toward a center of the processing container,
wherein the adjustment gas nozzle is provided within an angle range in which the exhaust body is formed, at a central angle with reference to the center of the processing container when viewed from a top,
the exhaust body includes a protruding portion formed on a portion of the side wall of the inner tube of the processing container toward an outside, and an exhaust slit formed at a tip of the protruding portion and communicating an inside of the inner tube and the space, and
the exhaust body is formed within a range of the central angle of 150° to 180°.

2. The processing apparatus according to claim 1, wherein the adjustment gas nozzle is provided at a position closer to the center of the processing container than the exhaust slit.

3. The processing apparatus according to claim 1, wherein the adjustment gas nozzle is provided at a position farther from the center of the processing container than the exhaust slit.

4. The processing apparatus according to claim 3, wherein the adjustment gas nozzle extends in a vertical direction along the inner wall of the inner tube.

5. The processing apparatus according to claim 4, wherein the adjustment gas nozzle includes a plurality of gas holes oriented toward the center of the processing container.

6. The processing apparatus according to claim 5, wherein the adjustment gas nozzle includes two gas nozzles disposed symmetrically with respect to a straight line that connects the center of the processing container and the processing gas nozzle.

7. The processing apparatus according to claim 6, wherein the processing container accommodates a plurality of substrates substantially horizontally at intervals in the vertical direction.

8. The processing apparatus according to claim 7, wherein the concentration adjustment gas is an inert gas.

9. The processing apparatus according to claim 1, wherein the adjustment gas nozzle extends in a vertical direction along the inner wall of the inner tube.

10. The processing apparatus according to claim 1, wherein the adjustment gas nozzle includes a plurality of gas holes oriented toward a center of the processing container.

11. The processing apparatus according to claim 1, wherein the adjustment gas nozzle includes two gas nozzles disposed symmetrically with respect to a straight line that connects the center of the processing container and the processing gas nozzle.

12. The processing apparatus according to claim 1, wherein the processing container accommodates a plurality of substrates substantially horizontally at intervals in the vertical direction.

13. The processing apparatus according to claim 1, wherein the concentration adjustment gas is an inert gas.

14. The processing apparatus according to claim 1, wherein the processing gas nozzle is plural, and
each processing gas nozzle includes a plurality of gas holes oriented toward the center of the processing container.

15. A processing apparatus comprising:
a processing container having a substantially cylindrical shape including an inner tube and an outer tube that are coaxially arranged with a space therebetween;
a processing gas nozzle extending in a longitudinal direction of the processing container along an inside of a side wall of the inner tube of the processing container;
an exhaust slit provided in an exhaust body formed on the side wall of the inner tube on an opposite side of the inner tube of the processing container to face the processing gas nozzle, the exhaust slit communicating an inside of the inner tube and the space; and
an adjustment gas nozzle provided within the exhaust body and configured to eject a concentration adjustment gas toward a center of the processing container,
wherein when a position of the processing gas nozzle is set as a starting point at a central angle of 0° with reference to the center of the processing container when viewed from a top, the exhaust body is formed within a range of the central angle of 150° to 180°.

16. The processing apparatus according to claim 15, wherein the exhaust slit has a rectangular shape having a long side in the longitudinal direction of the processing container.

17. The processing apparatus according to claim 15, wherein the adjustment gas nozzle includes two gas nozzles disposed symmetrically with respect to a straight line that connects the center of the processing container and a center of the exhaust slit.

18. The processing apparatus according to claim 15, wherein the processing apparatus further includes an exhauster that includes a vacuum pump and exhausts a gas discharged from an inside of the inner tube through the exhaust slit and then discharged through a gas outlet via the space between the inner tube and the outer tube.

19. A processing method comprising:
providing a processing apparatus including a processing container having a substantially cylindrical shape of an inner tube and an outer tube, the inner tube and the outer tube having a space therebetween;
carrying a substrate into the processing container; and
supplying a processing gas into the processing container from a processing gas nozzle provided in the processing container and extending in a longitudinal direction of the processing container along an inside of a side wall of the inner tube;
supplying a concentration adjustment gas from an adjustment gas nozzle provided in the processing container toward a center of the processing container; and
exhausting the processing gas and the concentration adjustment gas through an exhaust body formed on the side wall of the inner tube on an opposite side of the inner tube of the processing container that faces the processing gas nozzle,
wherein the adjustment gas nozzle is provided within the exhaust body in an angle range in which the exhaust body is formed, at a central angle with reference to the center of the processing container when viewed from a top,
the exhaust body includes a protruding portion formed on a portion of the side wall of the inner tube of the processing container toward an outside, and an exhaust slit formed at a tip of the protruding portion and communicating an inside of the inner tube and the space, and the exhaust body is formed within a range of the central angle of 150° to 180°.

* * * * *